United States Patent
Rayaprolu et al.

(10) Patent No.: US 11,221,912 B2
(45) Date of Patent: *Jan. 11, 2022

(54) MITIGATING AN UNDETECTABLE ERROR WHEN RETRIEVING CRITICAL DATA DURING ERROR HANDLING

(71) Applicant: Micron Technology, Inc., Boise, ID (US)

(72) Inventors: Vamsi Pavan Rayaprolu, San Jose, CA (US); Sivagnanam Parthasarathy, Carlsbad, CA (US); Sampath K. Ratnam, Boise, ID (US); Shane Nowell, Boise, ID (US); Renato C. Padilla, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 21 days.

This patent is subject to a terminal disclaimer.

(21) Appl. No.: 16/803,833

(22) Filed: Feb. 27, 2020

(65) Prior Publication Data

US 2020/0201710 A1 Jun. 25, 2020

Related U.S. Application Data

(63) Continuation of application No. 16/164,429, filed on Oct. 18, 2018, now Pat. No. 10,606,698.

(60) Provisional application No. 62/628,203, filed on Feb. 8, 2018.

(51) Int. Cl.
*G11C 29/00* (2006.01)
*G06F 11/10* (2006.01)
*G11C 29/52* (2006.01)
*G11C 7/04* (2006.01)
*G06F 11/00* (2006.01)

(52) U.S. Cl.
CPC ........ *G06F 11/1068* (2013.01); *G06F 11/008* (2013.01); *G11C 7/04* (2013.01); *G11C 29/52* (2013.01)

(58) Field of Classification Search
CPC ...... G06F 11/1068; G06F 11/008; G11C 7/04; G11C 29/52; G11C 11/406; G11C 11/40626; G11C 11/34
USPC .... 714/764, 703, 823, 824, 25, 38.1, 31, 32, 714/33, 35, 37, 47.1
See application file for complete search history.

(56) References Cited

U.S. PATENT DOCUMENTS

| | | |
|---|---|---|
| 2015/0100837 A1 | 4/2015 | Ku |
| 2016/0055056 A1 | 2/2016 | Son et al. |
| 2017/0177436 A1* | 6/2017 | Lee ........................ G11C 16/26 |
| 2018/0039538 A1 | 2/2018 | Freikorn et al. |
| 2019/0138390 A1* | 5/2019 | Fisher ............... H03M 13/2924 |

(Continued)

*Primary Examiner* — Christine T. Tu
(74) *Attorney, Agent, or Firm* — Lowenstein Sandler LLP

(57) ABSTRACT

A processing device reads data from a memory device in response to a received request and performs a first error control operation on the data based on an initial operating characteristic to correct one or more errors in the data. The processing device determines that the first error control operation based on the initial operating characteristic failed to correct the one or more errors in the data, modifies the initial operating characteristic to generate a modified operating characteristic and performs a second error control operation on the data based on the modified operating characteristic to correct the one or more errors in the data.

20 Claims, 5 Drawing Sheets

(56) References Cited

U.S. PATENT DOCUMENTS

2019/0206477 A1* 7/2019 Kim .................... G06F 11/1048

* cited by examiner

MITIGATING AN UNDETECTABLE ERROR WHEN RETRIEVING CRITICAL DATA DURING ERROR HANDLING

RELATED APPLICATION

This application is a continuation of U.S. patent application Ser. No. 16/164,429 filed on Oct. 18, 2018, which claims the benefit under 35 U.S.C. § 119(e) of U.S. Provisional Application No. 62/628,203 filed on Feb. 8, 2018, the entire contents of each of which are hereby incorporated by reference herein.

TECHNICAL FIELD

The present disclosure generally relates to a memory sub-system, and more specifically, relates to mitigating an undetectable error when retrieving critical data during error handling by a memory sub-system.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

DETAILED DESCRIPTION

Figure 1:
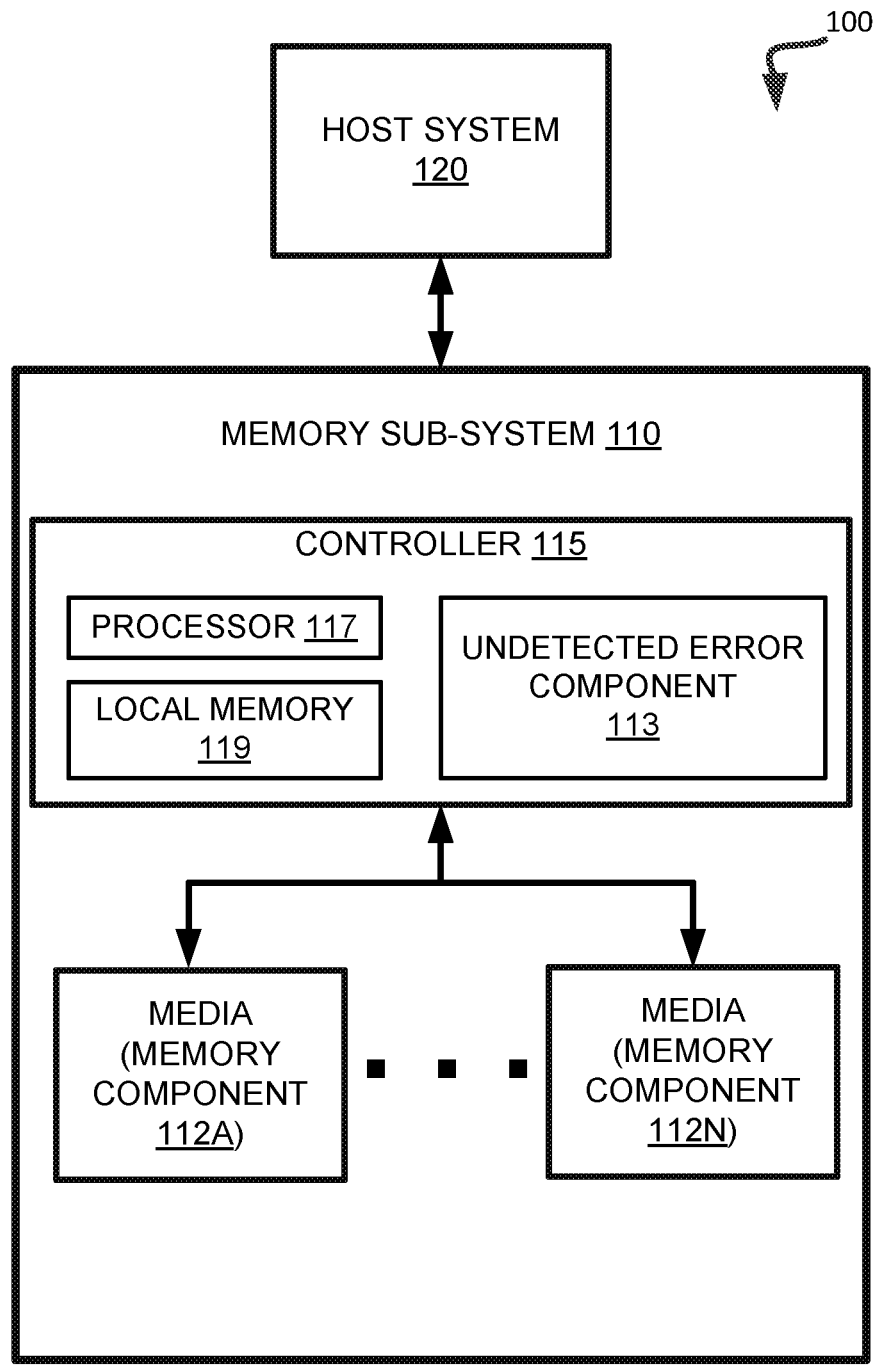
FIG. 1 illustrates an example computing environment that includes a memory sub-system in accordance with some embodiments of the present disclosure.

Aspects of the present disclosure are directed to mitigating an undetectable error when retrieving critical data during error handling by a memory sub-system. A memory sub-system is also hereinafter referred to as a "memory device." An example of a memory sub-system is a storage system, such as a solid-state drive (SSD). The memory sub-system can be a hybrid memory/storage sub-system. In general, a host system can utilize a memory sub-system that includes one or more memory components. The host system can provide data to be stored at the memory sub-system and can request data to be retrieved from the memory sub-system.

A conventional memory sub-system can implement an error detection and correction (i.e., an error control) operation for the data that is stored at and/or retrieved from the memory components of the memory sub-system. The error control operation can encode user data and store the encoded user data at the memory sub-system. Subsequently, when the user data is to be read by the memory sub-system, the error control operation can be performed by retrieving the encoded user data and decoding the encoded user data and detecting any errors that may have been caused by noise or other such impairments that can cause a value or bit of the user data to switch (e.g., from a '0' value to a '1' value or vice versa) when the user data is stored or read. The detected error can subsequently be corrected based on the error control operation.

The retrieval of the user data can be based on critical data that is stored at the memory sub-system. The critical data can be information that can be used by the memory sub-system when retrieving the user data. For example, the critical data can be used by the memory sub-system to determine how to read corresponding user data that is stored at the memory sub-system and/or how to perform the error control operation after the corresponding user data has been read. As an example, the critical data can specify a temperature value of the memory sub-system when a particular user data was stored at the memory sub-system. The temperature value can later be used by the memory sub-system to determine a particular read level offset (e.g., a threshold voltage) that is to be used when retrieving the user data and then the error control operation can be performed for the retrieved user data. For example, after receiving a request for the user data, critical data identifying the temperature value of the memory sub-system when the user data was stored can be received and an error control operation can be performed on the critical data. The use of the read level offset to retrieve the user data can result in the user data having fewer potential errors and the error control operation can be performed for the user data with fewer errors.

If the critical data retrieved by a conventional memory sub-system includes undetectable errors, then the performance of the error control operation on the user data can result in a failure of the error control operation for the user data. For example, the error control operation can first be performed with the critical data and if the critical data includes an undetectable error, then the information specified by the critical data (e.g., the temperature value) can be incorrect. The error control operation for the user data can then use the incorrect critical data information, resulting in a failure of the error control operation for the user data.

Aspects of the present disclosure address the above and other deficiencies by mitigating an undetectable error when retrieving critical data during error handling by a memory sub-system. For example, the memory sub-system can initiate an undetectable error control process when a prior error control operation fails. The undetectable error control process can result in a change of an operating characteristic (e.g., the temperature value) used in the error control operation. The error control operation that failed can then be performed again for the user data with the changed operating characteristic. As an example, if the error control operation failed when using critical data that specified a read offset based on the write temperature being 30 degrees Celsius and the read temperature being 70 degrees Celsius (e.g., a positive temperature read offset), then a negative temperature read offset can be assumed to have been correct and the error control operation can be performed again with the user data using the assumed negative temperature read offset. Thus, the error control operation can be performed again with a different operating characteristic that is complementary to the prior operating characteristic when the error control operation had failed with respect to the user data.

Advantages of the present disclosure include, but are not limited to, an increased reliability of data stored at the memory sub-system. For example, the undetectable error control operation can be performed for user data after a failed prior error control operation, which can result in a subsequent successful error control operation. Thus, the user data can be more reliably retrieved from the memory sub-system.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative- and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes an undetected error component 113 that can be used to perform a subsequent error control operation when the error control operation has failed at a prior time. In some embodiments, the controller 115 includes at least a portion of the undetected error component 113. For example, the controller 115 can include a processor 117 (processing device) configured to execute instructions stored in local memory 119 for performing the operations described herein. In some embodiments, the undetected error component 113 is part of the host system 110, an application, or an operating system.

The undetected error component 113 can retrieve data from the memory components 112A to 112N of the memory sub-system 110. The undetected error component 113 can retrieve critical data associated with the data and can further perform an error control operation for the data based on the critical data. The undetected error component 113 can determine that the error control operation failed and can change an operating characteristic based on the critical data that was used during the error control operation. Subsequently, the undetected error component 113 can perform the error control operation again with the changed operating characteristic to recover the data. Further details with regards to the operations of the undetected error component 113 are described below.

Figure 2:
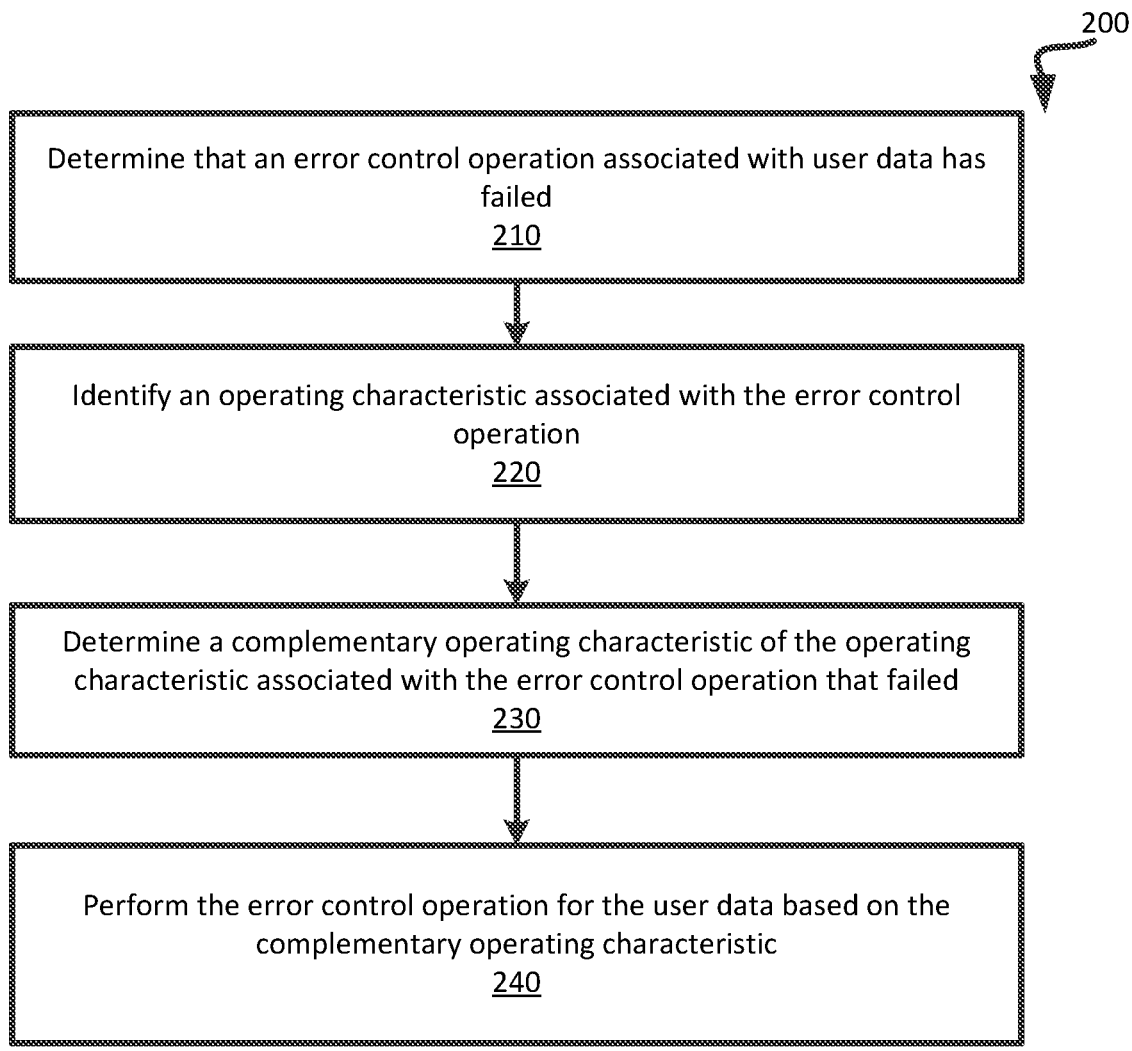
FIG. 2 is a flow diagram of an example method to mitigate an undetectable error from critical data in accordance with some embodiments of the present disclosure

FIG. 2 is a flow diagram of an example method 200 to mitigate an undetectable error from critical data, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the undetectable error component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 210, the processing device determines that an error control operation associated with user data has failed. The user data can be data that is to be retrieved in response to a read request for the user data. The error control operation can include the performance of a read operation to retrieve the user data and error detection and correction operations to detect errors and correct any of the detected errors from the retrieved user data. The user data can be associated with critical data. In some embodiments, the critical data can specify an operating characteristic of the memory sub-system when the user data was stored at the memory sub-system. For example, the critical data can be stored at the memory sub-system when the user data is also stored at the memory sub-system. The error control operation can then be performed for the user data with information specified by the critical data. In some embodiments, the critical data can specify a temperature of the memory sub-system when the user data was stored at the memory sub-system. In the same or alternative embodiments, the critical data can specify other characteristics of the memory sub-system such as an environmental condition (e.g., pressure, altitude) of the memory sub-system, a time when the user data associated with the critical data was written to the memory sub-system, etc. The error control operation can utilize the specified temperature by performing a read operation on the user data based on the specified temperature. The read operation can correspond to a use of a read threshold voltage that is based on the temperature. For example, different read threshold voltages can be applied to the memory sub-system to retrieve the user data when the memory sub-system is at different temperatures. In the same or alternative embodiments, the error control operation can utilize the specified the temperature by performing an error detection and correction operation on the user data based on the temperature. For example, the temperature of the memory sub-system can be used to correct errors in the user data after the user data has been retrieved. In some embodiments, the temperature (or other such critical data) can be used to utilize a particular error control operation out of multiple error control operations that can be performed by the memory sub-system.

At block 220, the processing device identifies an operating characteristic associated with the error control operation. The operating characteristic can be a parameter used by the error control operation. As previously described, the operating characteristic can specify a temperature of the memory sub-system when the user data was stored at the memory sub-system. In some embodiments, the operating characteristic can be a difference between the temperature of the memory sub-system when the user data was stored at the memory sub-system and a current temperature of the memory sub-system when the user data is to be retrieved. The difference can be a positive temperature difference when the current temperature of the memory sub-system is higher than the prior temperature of the memory sub-system when the user data was stored. The difference can be a negative temperature difference when the current temperature of the memory sub-system is lower than the prior temperature of the memory sub-system when the user data was stored. At block 230, the processing logic determines a complementary operating characteristic of the operating characteristic associated with the error control operation that failed. The complementary operating characteristic can be different than the operating characteristic that was used in the failed error control operation. For example, if the operating characteristic of the failed error control operation corresponds to a positive temperature offset, then the complementary operating characteristic can be a negative temperature offset. The complementary operating characteristic can replace the operating characteristic of the error control operation that failed. Thus, the complementary operating characteristic can replace an initial operating characteristic that was used by the error control operation when the error control operation failed.

Referring to FIG. 2, at block 240, the processing device performs the error control operation for the user data based on the complementary operating characteristic. For example, the error control operation that failed can be performed again based on the complementary operating characteristic instead of the prior operating characteristic. For example, a read operation can be performed with a different read threshold voltage that corresponds to the complementary operating characteristic or the error detection and correction operation can be based on the complementary operating characteristic as opposed to the prior operating characteristic used by the error control operation.

Figure 3:
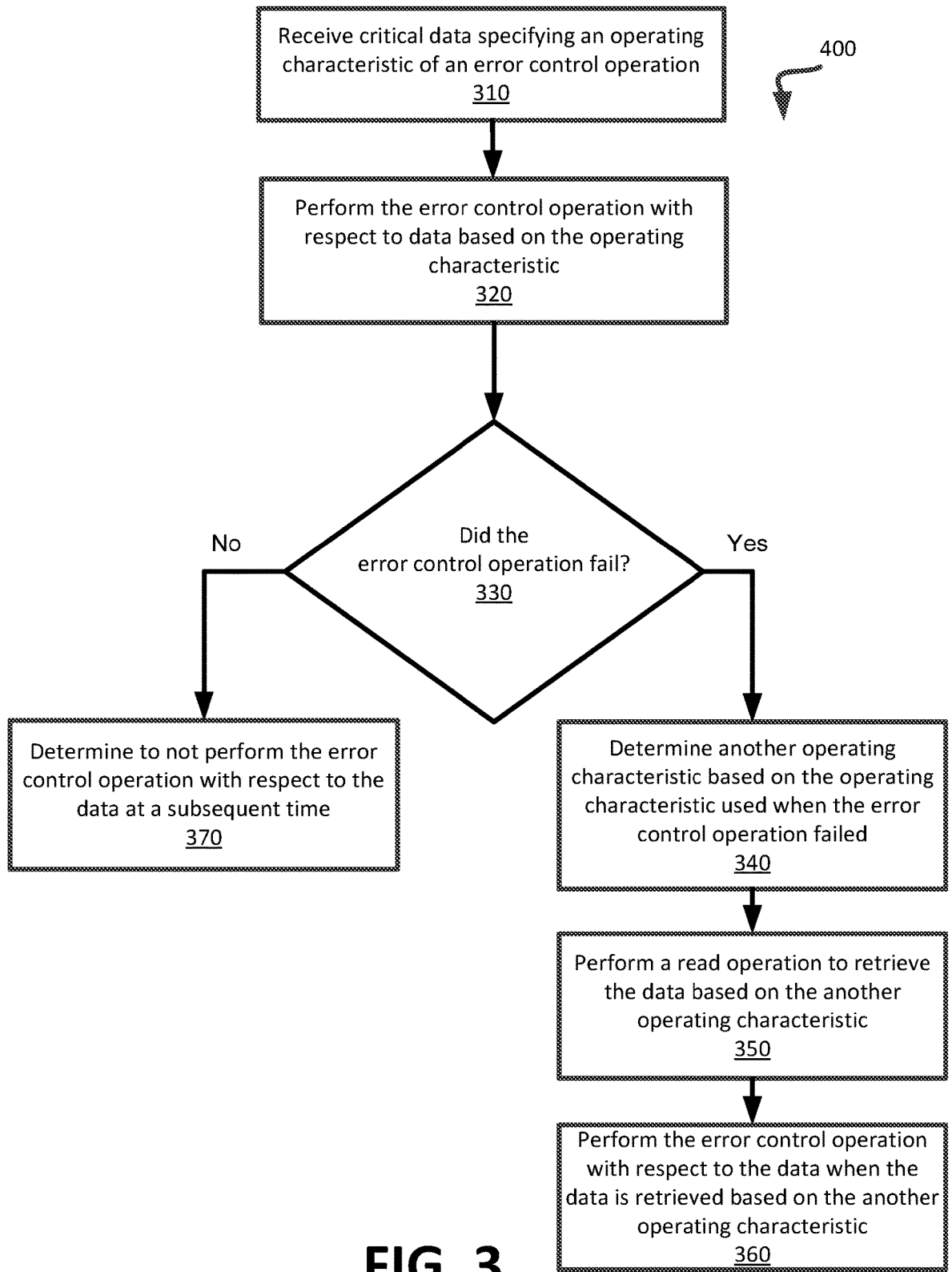
FIG. 3 is a flow diagram of an example method to determine to repeat the performance of an error control operation based on a changed operating characteristic in accordance with some embodiments of the present disclosure.

FIG. 3 is a flow diagram of an example method 300 to determine to repeat the performance of an error control operation based on a changed operating characteristic in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the undetectable error component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 310, a processing device receives critical data specifying an operating characteristic of an error control operation. The operating characteristic can be a parameter used during the performance of the error control operation. At block 320, the processing device performs the error control operation with respect to data based on the operating characteristic. For example, the error control operation can use the operating characteristic when reading the data and/or error detection and correction for the data. At block 330, the processing device determines whether the error control failed. In some embodiments, the error control operation can be considered to fail if the number of detected errors present in the retrieved data exceeds an error correction capability of the error control operation. For example, the error control operation can be considered to fail when the data includes more bit errors than the number of bits that the error control operation can correct. The error control operation can be considered to be successful (e.g., not fail) when the number of detected errors present in the retrieved data is less than or equal to an error correction capability of the error control operation. For example, the error control operation can be considered to be successful when the data includes the same or fewer bit errors than the number of bits that the error control operation can correct. If the error control operation did not fail, then at block 370, the processing device determines to not perform the error control operation with respect to the data at a subsequent time. In some embodiments, the error control operation may not be performed for the data until another read operation for the data has been received. Otherwise, if the error control operation did fail, then at block 340, the processing device determines another operating characteristic based on the operating characteristic used when the error control operation failed. For example, if the operating characteristic specified a temperature value, then the other operating characteristic can be one or more other temperature values that are different than the temperature value of the operating characteristic. At block 350, the processing device performs a read operation to retrieve the data based on the other operating characteristic. For example, a read threshold voltage that is defined by the other operating characteristic can be applied to the memory sub-system to retrieve the data. At block 360, the processing device performs an error detection and correction operation with respect to the data when the data is retrieved based on the other operating characteristic. For example, the error detection and correction operation can be performed with the data that has been retrieved by applying the read threshold voltage that is defined by the other operating characteristic.

In some embodiments, the error control operation can be performed based on the operating characteristic to reduce a number of steps or processes utilized by the error control operation to correct errors in the data. As a result, the use of the operating characteristic can reduce latency in a memory sub-system when performing read operations that utilize the error control operation. However, if the operating characteristic is incorrect, then the utilization of the error control operation based on the other operating characteristic can be performed. In such a case, the utilization of the error control operation based on the other operating characteristic can be added to the error control flow if the prior error control operation failed as a result of the prior operating characteristic being incorrect.

In some embodiments, multiple other operating characteristics can be determined and used by the error control operation (e.g., by the corresponding read operation and/or the error detection and control operation). For example, if the error control operation failed when a first operating characteristic was used (e.g., a first temperature value that is specified by the critical data), then the error control operation can be performed with a second operating characteristic (e.g., a second temperature value). If the error control operation fails again, then the error control operation can be performed again with a third operating characteristic (e.g., a third temperature value that is different than the prior temperature values).

In the same or alternative embodiments, the error control operation can utilize a low-density parity-check (LDPC) code to detect and correct errors in the data. The error control operation can be repeated for additional times or instances. In some embodiments, the error control operating utilizing an LDPC code can be performed by generating a sparse parity-check matrix to detect and correct errors of the data. Additional matrices can be generated for each subsequent performance of the error control operation.

Figure 4:
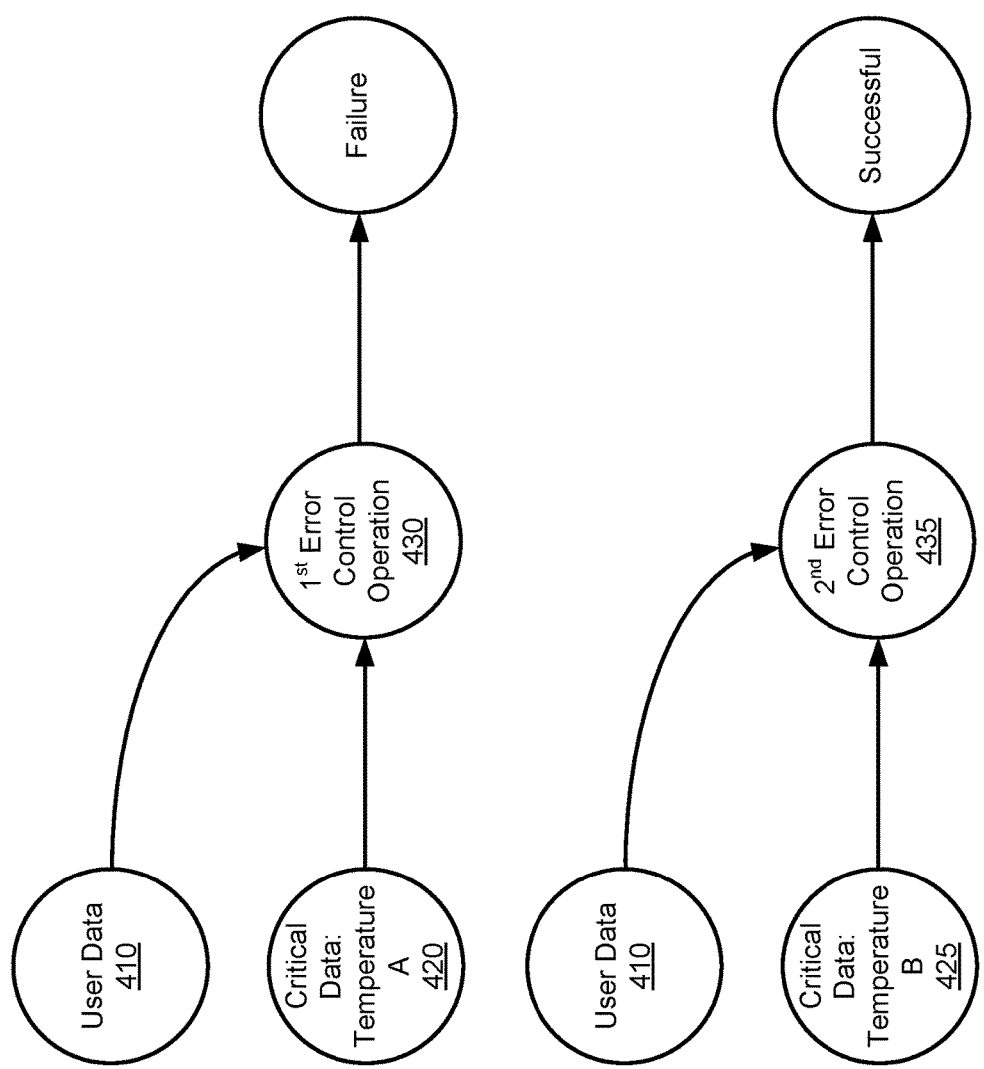
FIG. 4 illustrates critical data with an undetectable error and critical data specifying a changed operating characteristic in accordance with some embodiments of the present disclosure.

FIG. 4 illustrates critical data with an undetectable error and critical data specifying a changed operating characteristic in accordance with some embodiments of the present disclosure.

As shown in FIG. 4, a first error control operation 430 can be performed for user data 410 by using critical data 420. The critical data 420 can specify a temperature value 'A.' The first error control operation 430 for the user data 410 can fail when using the critical data 420. In some embodiments, when the first error control operation 430 fails, then a second error control operation (e.g., of the first type as the first error control operation) can be performed for the user data 410 with new critical data 425. For example, the new critical data 425 can specify another temperature value 'B.' The second error control operation 435 for the user data 410 can succeed when using the new critical data 425.

Figure 5:
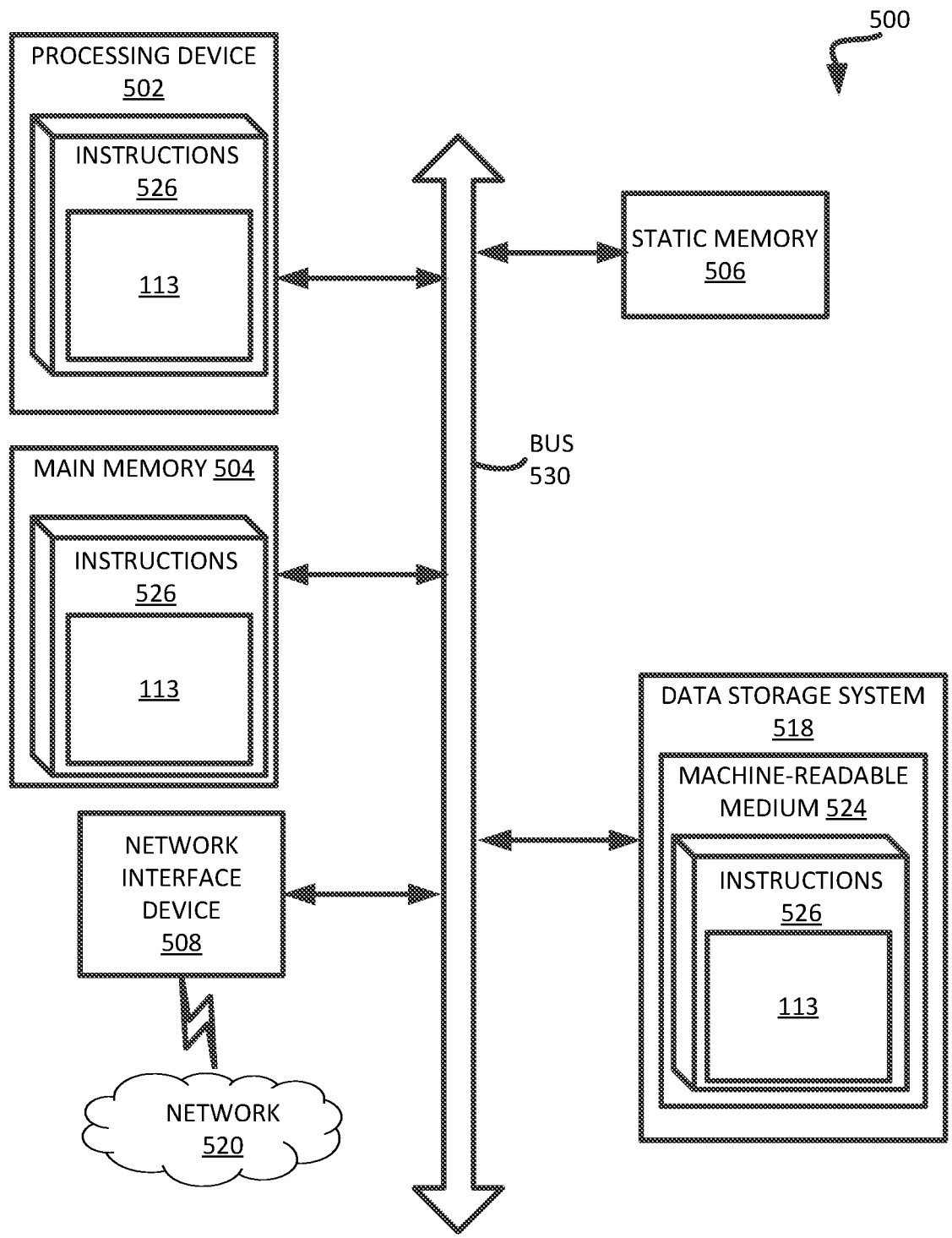
FIG. 5 is a block diagram of an example computer system in which implementations of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the undetectable error component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to an undetectable error component (e.g., the undetectable error component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory device; and
   a processing device, operatively coupled with the memory device, to perform operations comprising:
   reading data from the memory device in response to a received request;
   performing a first error control operation on the data based on an initial operating characteristic to correct one or more errors in the data;
   determining that the first error control operation based on the initial operating characteristic failed to correct the one or more errors in the data;
   modifying the initial operating characteristic to generate a modified operating characteristic; and
   performing a second error control operation on the data based on the modified operating characteristic to correct the one or more errors in the data.

2. The system of claim 1, wherein the processing device is to perform further operations comprising:
   identifying critical data, wherein the first error control operation is performed by using the critical data.

3. The system of claim 2, wherein the critical data specifies a temperature associated with the memory device when the data was written to the memory device.

4. The system of claim 3, wherein the initial operating characteristic corresponds to a first offset value that is to be used with the first error control operation, and wherein the first offset value pertains to the temperature associated with the memory device when the data was written to the memory device.

5. The system of claim 4, wherein the modified operating characteristic specifies a second offset value that is to be used with the second error control operation at a subsequent time, and wherein the second offset value is different than the first offset value.

6. The system of claim 5, wherein the first offset value is based on a first read threshold voltage that is applied to the memory device to retrieve the data, and the second offset value is based on a second read threshold voltage that is applied to the memory device to retrieve the data.

7. The system of claim 1, wherein the modified operating characteristic is different than the initial operating characteristic.

8. A method comprising:
   reading data from a memory device in response to a received request;
   performing a first error control operation on the data based on an initial operating characteristic to correct one or more errors in the data;
   determining that the first error control operation based on the initial operating characteristic failed to correct the one or more errors in the data;
   modifying the initial operating characteristic to generate a modified operating characteristic; and
   performing a second error control operation on the data based on the modified operating characteristic to correct the one or more errors in the data.

9. The method of claim 8, wherein identifying the operating characteristic comprises:
   identifying critical data, wherein the first error control operation is performed by using the critical data.

10. The method of claim 9, wherein the critical data specifies a temperature associated with the memory device when the data was written to the memory device.

11. The method of claim 10, wherein the initial operating characteristic corresponds to a first offset value that is to be used with the first error control operation, and wherein the first offset value pertains to the temperature associated with the memory device when the data was written to the memory device.

12. The method of claim 11, wherein the modified operating characteristic specifies a second offset value that is to be used with the second error control operation at a subsequent time, and wherein the second offset value is different than the first offset value.

13. The method of claim 12, wherein the first offset value is based on a first read threshold voltage that is applied to the memory device to retrieve the data, and the second offset value is based on a second read threshold voltage that is applied to the memory device to retrieve the data.

14. The method of claim 8, wherein the modified operating characteristic is different than the initial operating characteristic.

15. A non-transitory computer readable medium comprising instructions, which when executed by a processing device, cause the processing device to perform operations comprising:
   reading data from a memory device in response to a received request;
   performing a first error control operation on the data based on an initial operating characteristic to correct one or more errors in the data;
   determining that the first error control operation based on the initial operating characteristic failed to correct the one or more errors in the data;
   modifying the initial operating characteristic to generate a modified operating characteristic; and
   performing a second error control operation on the data based on the modified operating characteristic to correct the one or more errors in the data.

16. The non-transitory computer readable medium of claim 15, wherein to identify the initial operating characteristic, the operations further comprise:
   identifying critical data, wherein the first error control operation is performed by using the critical data.

17. The non-transitory computer readable medium of claim 16, wherein the critical data specifies a temperature associated with the memory device when the data was written to the memory device.

18. The non-transitory computer readable medium of claim 17, wherein the initial operating characteristic corresponds to a first offset value that is to be used with the first error control operation, and wherein the first offset value pertains to the temperature associated with the memory device when the data was written to the memory device.

19. The non-transitory computer readable medium of claim 18, wherein the modified operating characteristic specifies a second offset value that is to be used with the second error control operation at a subsequent time, and wherein the second offset value is different than the first offset value.

20. The non-transitory computer readable medium of claim 19, wherein the first offset value is based on a first read threshold voltage that is applied to the memory device to retrieve the data, and the second offset value is based on a second read threshold voltage that is applied to the memory device to retrieve the data.

* * * * *